United States Patent [19]

Seitz et al.

[11] 3,956,710

[45] May 11, 1976

[54] PHASE LOCKED LOOP LOCK DETECTOR AND METHOD

[75] Inventors: Martin V. Seitz, Fox River Grove; Harry A. Hennen, Bloomingdale, both of Ill.

[73] Assignee: Motorola, Inc., Chicago, Ill.

[22] Filed: Nov. 20, 1974

[21] Appl. No.: 525,521

[52] U.S. Cl. .......................... 331/1 A; 307/233 R; 328/133; 331/11; 331/17; 331/2 S
[51] Int. Cl.² .......................................... H03B 3/04
[58] Field of Search ................ 331/1 A, 17, 25, 11, 331/12; 328/133, 134; 307/232, 233 R, 233 A

[56] References Cited
UNITED STATES PATENTS

| | | | |
|---|---|---|---|
| 3,185,938 | 5/1965 | Pelosi................................... | 331/11 |
| 3,401,353 | 9/1968 | Hughes............................. | 331/18 X |
| 3,611,175 | 10/1971 | Boelke.............................. | 331/17 X |
| 3,694,766 | 9/1972 | Boelke.............................. | 331/25 X |

*Primary Examiner*—Siegfried H. Grimm
*Attorney, Agent, or Firm*—James W. Gillman; Eugene A. Parsons

[57] ABSTRACT

Apparatus and method for determining when a phase lock loop is in a state of lock is disclosed. The input frequency and the VCO frequency of a phase locked loop are combined by a difference multiplier to produce a signal having their difference frequency. The difference frequency signal is transformed into a squarewave by a limiter and the squarewave is then fed into a binary counter which counts the frequency of the squarewave pulses. Circuitry including a clock, two monostables, an AND gate, and a one cycle memory flip-flop periodically monitors the count of the binary counter and produces a signal indicating a state of unlock when the count of the binary counter exceeds a predetermined limit. An inhibit signal which prevents the binary counter from continuing to count is generated when the predetermined count limit has been reached in any one monitored time period.

9 Claims, 3 Drawing Figures

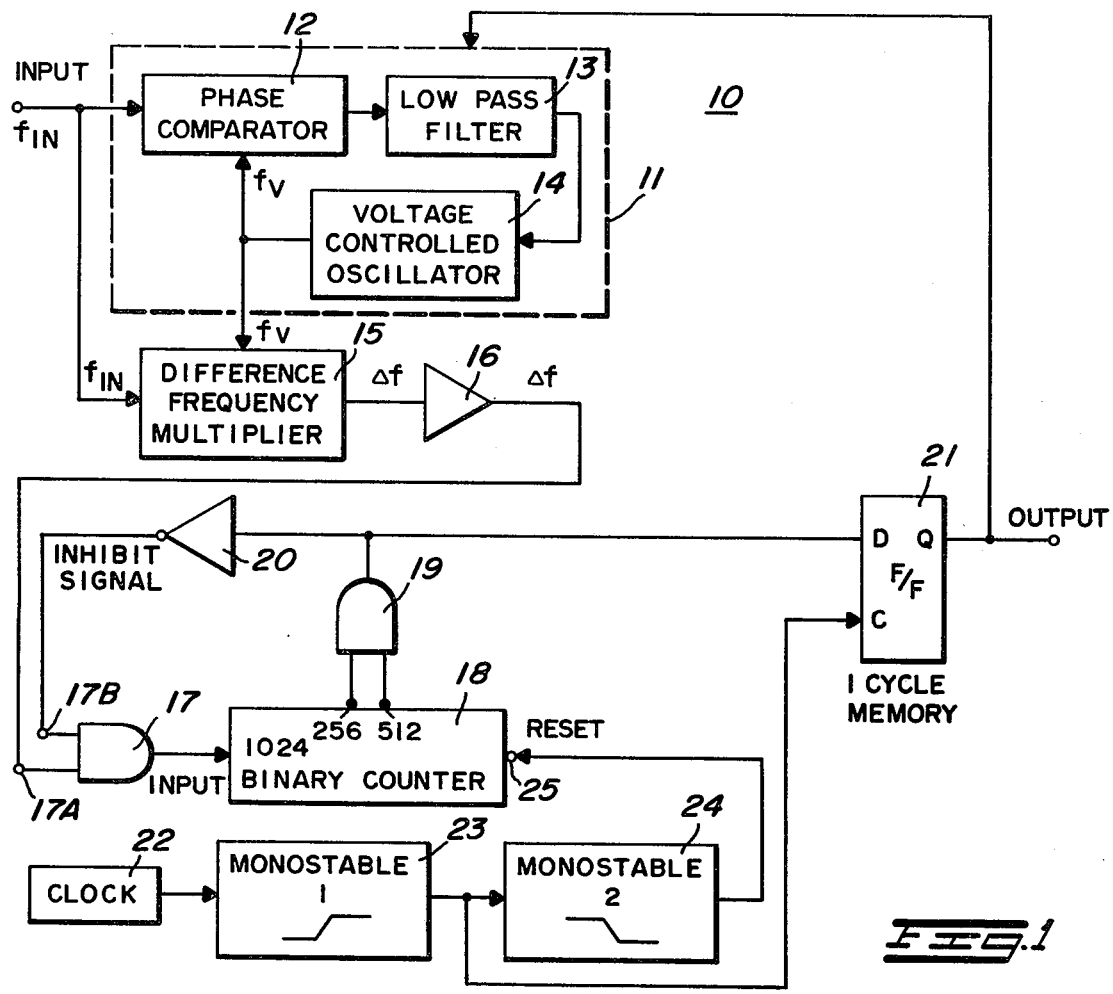
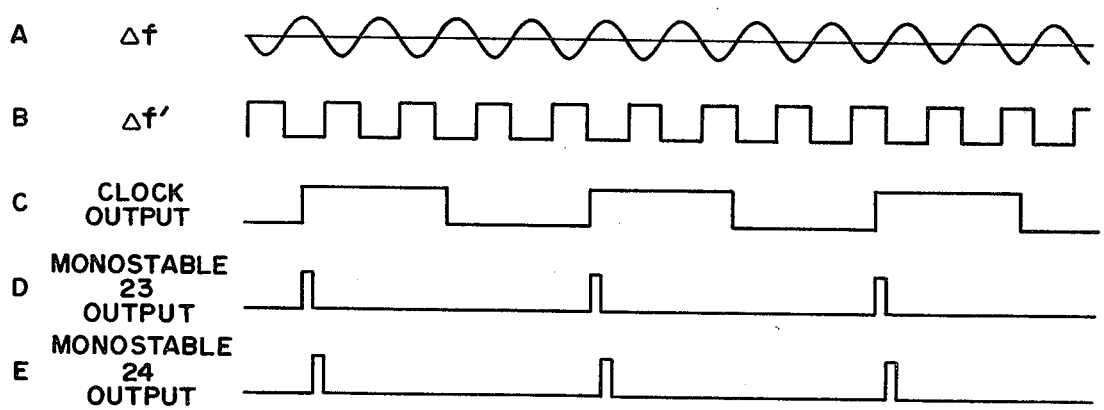

PHASE LOCKED LOOP LOCK DETECTOR AND METHOD

BACKGROUND OF THE INVENTION

Phase locked loops (PLL) are well known in the state of the art and essentially consist of; a phase comparator for receiving and comparing an external input signal to a voltage controlled oscillator (VCO) signal, a low pass filter for receiving the output of the phase comparator, and a VCO receiving the output of the low pass filter. Basically the phase comparator forms a difference signal by comparing the external input signal and the VCO signal. The difference signal is passed through a low pass filter to obtain a DC control voltage which controls the frequency of the VCO. When the frequency of the external input signal and the frequency of the voltage controlled oscillator are substantially identical, the phase locked loop is said to be in a state of lock. Conversely, when the external input signal and the VCO signal differ in frequency by more than a predetermined amount, the PLL is said to be in a state of unlock.

It is useful to determine when the phase locked loop is in a state of lock so that certain loop parameters can be changed to insure narrow loop tracking in order to reject noise and other interferring signals. However, when the phase locked loop is not in a state of lock wide loop tracking parameters are desired so that the loop can aquire lock over a wide frequency range. The concept of changing loop bandwidth in response to whether the phase locked loop is in a state of lock or not is known, as in U.S. Pat. No. 3,805,183. Several systems for changing phase locked loop parameters in response to a control system are described in U.S. Pat. No. 3,209,271. Prior art state of lock detectors sense the signal amplitude of the phase comparator output or the low pass filter output, to determine whether the phase locked loop is in a state of lock or unlock. However, if the input signals to the phase comparator are noisy or possess low frequency modulation, the prior art detection schemes will give erroneous readings as to whether the phase locked loop is in a state of lock.

SUMMARY OF THE INVENTION

An object of this invention is to provide an improved method and apparatus for determining when two input signals differ in frequency by more than a predetermined amount.

Another object of this invention is to provide an improved lock detector for use with a phase locked loop.

The present specification describes a frequency difference detector for determining when the frequency of a first signal differs from the frequency of a second signal and provides a difference indicating signal. The frequency difference detector includes: difference frequency means for receiving a first and a second signal and producing a third signal having a frequency equal to the difference between the first signal frequency and the second signal frequency, frequency counter means coupled to the output of the difference frequency means for receiving the third signal and counting the number of transitions of said third signal about an arbitrary reference level, and comparator means coupled to the frequency counter means for comparing the number of transitions occurring in a predetermined time period to a predetermined decision level and generating a lock signal indicating the magnitude of the number of transitions occurring in the time period relative to the predetermined decision level.

The input signal to a phase locked loop and the output signal from the VCO in the phase locked loop are mixed together in a difference frequency multiplier and a signal having their difference frequency is obtained. The difference frequency signal is then passed through a limiter which creates a squarewave having the same frequency as the difference frequency signal. The squarewave is then coupled into a binary counter which counts the frequency of the squarewave pulses by counting the number of transitions of the squarewave about an arbitrary reference level. An AND gate is connected to the binary counter and produces an output when a predetermined count has been obtained. A clock, a first monostable, and a one cycle memory flip-flop periodically monitor the output of the AND gate and create an output signal which indicates whether a predetermined count (decision level) has been obtained. An inverter monitors the output of the AND gate and develops an inhibit signal which prevents the binary counter from continuing to count after the predetermined count level has been reached. A second monostable is used to periodically reset the binary counter and recommence the counting process.

By creating a difference frequency signal and periodically determining its frequency by counting, a lock detector which has excellent noise immunity is obtained. The presence of low frequency modulation on the external input signal or the VCO signal, now merely results in a higher difference frequency count and can be compensated for by selecting a higher predetermined decision level. The lock indicating output signal can then be fed back to the phase locked loop and used to vary loop parameters such as bandwidth, loop gain, damping factor, etc.

DESCRIPTIONS OF THE DRAWINGS

For a more complete understanding of the invention, reference should be made to the drawings in which:

FIG. 1 is a block diagram of a phase locked loop system using the inventive lock detector;

FIG. 2 is a series of graphs illustrating the voltage waveforms present at several locations in FIG. 1;

DETAILED DESCRIPTION OF PREFERRED EMBODIMENTS OF THE INVENTION

Figure 3:
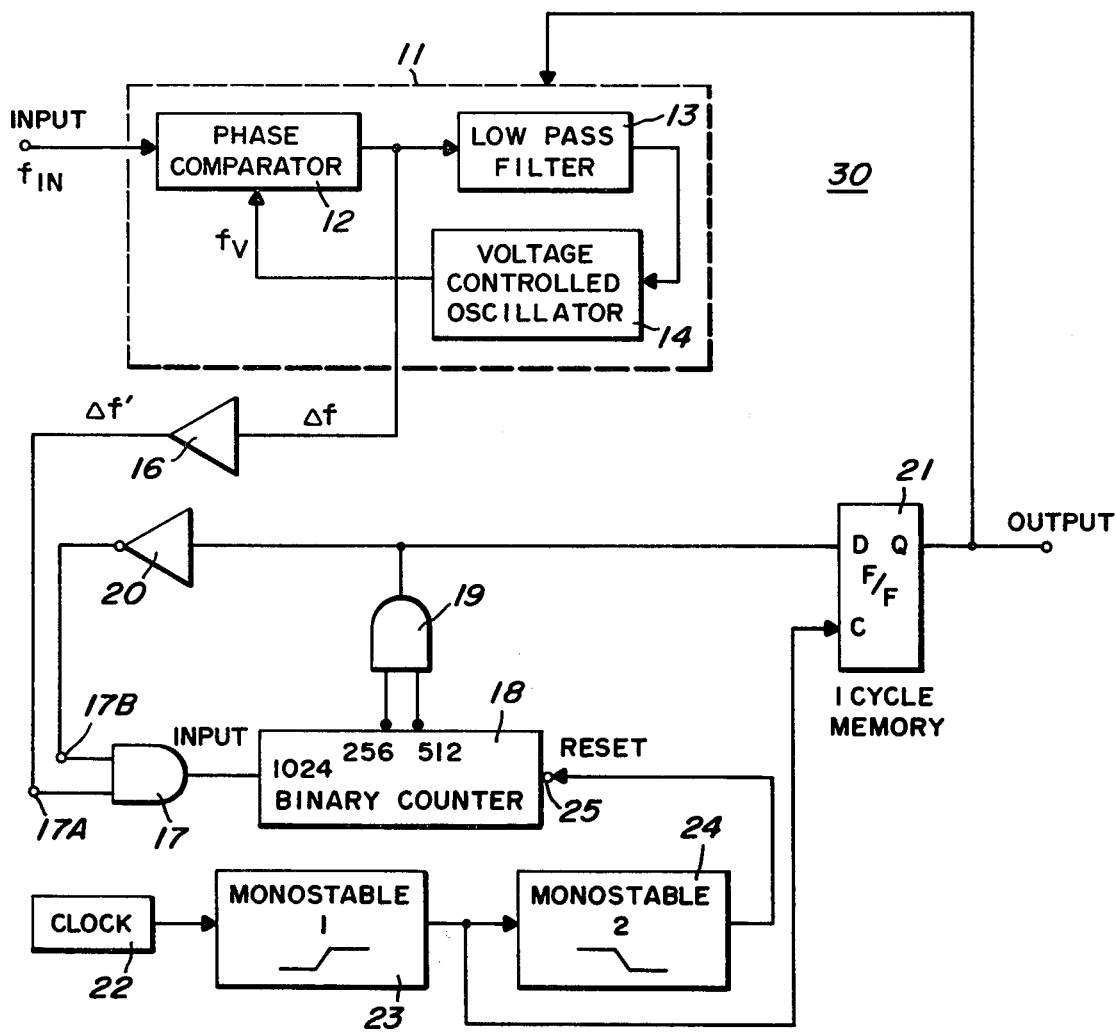
FIG. 3 is a block diagram of another embodiment of a system including a phase locked loop and the inventive lock detector.

Referring to FIG. 1, a system 10 is shown which includes a phase locked loop 11 (shown dotted) and an embodiment of the inventive lock detector. The phase locked loop 11 is shown comprising a phase comparator 12, a low pass filter 13 coupled to the output of the comparator, and a voltage controlled oscillator 14 coupled to the output of the filter. The output signal ($f_v$) of the voltage controlled oscillator (VCO) 14 is coupled to phase comparator 12 and phase comparator 12 also receives an external input signal ($f_{in}$). Although phase locked loop 11 has been shown consisting of the indicated components connected in a loop, other more complicated phase locked loops can be used with the inventive lock detector system disclosed herein.

The basic operation of phase locked loop 11 consists of phase comparator 12 comparing the phase of input signal $f_{in}$ and VCO signal $f_v$ and developing an output voltage proportional to the relative phase difference between the two input signals. The output of phase comparator 12 is fed into low pass filter 13 and the DC output of filter 13 is coupled to VCO 14 and controls the output frequency of VCO 14 signal $f_v$ which is coupled to phase comparator 12.

The external input signal ($f_{in}$) and the VCO output signal ($f_v$) are also coupled to a difference frequency multiplier 15 whose output signal ($\Delta f$ shown in FIG. 2A) has a frequency equal to the difference between the frequencies of $f_{in}$ and $f_v$. The output of difference frequency multiplier 15 is connected to the input of a limiter 16 and the output of limiter 16 ($\Delta f'$ shown in FIG. 2B) is connected to an input terminal 17A of an AND gate 17. The output of AND gate 17 is connected to the input terminal of a binary counter 18 having a count capacity of 1024. An AND gate 19 has one input terminal connected to an internal storage cell of binary counter 18 which is activated when a count of 512 is obtained and another input terminal connected to an internal storage cell of binary counter 18 which is activated when a count of 256 is obtained. The output of AND gate 19 is therefore activated when both internal storage cells are simultaneously activated by a count of 768 being made by binary counter 18. The output of AND gate 19 is connected to the input of an inverter 20 and a sampling terminal D of a one cycle memory flip-flop 21. The output of inverter 20, which functions as an inhibit signal for binary counter 18, is connected to a second input terminal 17B of AND gate 17. A clock 22 generates a squarewave output timing signal (shown in FIG. 2C) which is coupled to the input of a monostable 23 which is triggered by positive going pulses and the output of monostable 23 is connected to a clock terminal C of one cycle memory flip-flop 21 and the input of a monostable 24 which is triggered by negative going pulses. The output of monostable 24 is connected to a reset terminal 25 of binary counter 18. The lock indication signal is generated at a terminal Q of flip-flop 21 and is shown coupled to PLL 11.

Now referring to FIG. 2, the waveform $\Delta f$ is shown in FIG. 2A as being a sinusoidal voltage waveform having a frequency equal to the difference between $f_{in}$ and $f_v$. $\Delta f'$, the output of limiter 16, is shown in FIG. 2B as consisting of a squarewave having the same frequency as limiter input $\Delta f$. The output voltage of clock 22 is shown in FIG. 2C as a periodic squarewave having a relatively large cycle time. A clock frequency of 100Hz is suitable. The output of positive going monostable 23 is shown in FIG. 2D as a short pulse triggering upon the positive going edge of the output of clock 22. The output of monostable 24 is shown in FIG. 2E as a short pulse triggering on the negative going edge of the output of monostable 23.

The input signal ($f_{in}$) and the VCO signal $f_v$ are combined in difference frequency multiplier 15 and a difference frequency signal $\Delta f$ is created. A normal RF mixer followed by a low pass filter would perform the function of difference frequency multiplier 15 and many types of difference frequency multipliers are commonly available. The difference frequency $\Delta f$ is then converted into a squarewave ($\Delta f'$) by limiter 16. Limiter 16 can be either a differential amplifier used as a comparator, a high gain common emitter amplifier whose output varies between saturation and cutoff followed by an invertor, or many other standard circuits. The reason for converting the difference frequency into a squarewave is to facilitate logical gating and counting the frequency of difference frequency signal $\Delta f$ by counter 18. The $\Delta f'$ signal is passed through AND gate 17 when no inhibit signal is present and the number of transitions of signal $\Delta f'$ about an arbitrary reference level is counted by binary counter 18 until a count of 768 is obtained, whereupon AND gate 19 develops a high logic state output. The abritrary reference level is the voltage decision level above which binary counter 18 will register receiving a pulse and is inherent in the counter itself. The reference level is arbitrary because limiter 16 can be designed to superimpose any DC level on the $\Delta f'$ signal. The count of counter 18 is a measure of the frequency of signal $\Delta f'$. The high logic state of AND gate 19 is converted to a low logic state inhibit signal by inverter 20 and this inhibit signal, which is coupled to input terminal 17B of AND gate 17, prevents AND gate 17 from passing any more squarewave pulses of input signal $\Delta f'$. Thus the counting action of binary counter 18 is inhibited by a predetermined decision level count being attained by counter 18.

Clock 22 generates a squarewave timing signal (FIG. 2C) for periodically monitoring the output of AND gate 19 and resetting binary counter 18. The output pulses of monostable 23 (FIG. 2D) cause flip-flop 21 to transfer the logic state present at terminal D of flip-flop 21 to an output terminal Q of flip-flop 21. Terminal Q then remains in the transferred logic state until another output pulse from monostable 23 is received at terminal C. One cycle memory flip-flops like flip-flop 21 are commonly available, and also can be constructed from standard digital circuits. Thus periodically the output count of binary counter 18 is sampled by flip-flop 21 and a count indication signal which serves as a state of lock indication signal is generated at terminal Q of flip-flop 21. After the output of monostable 23 causes flip-flop 21 to sample the output of AND gate 19 to determine whether a predetermined count number has been reached by binary counter 18, the negative going edge of the output of monostable 23 causes monostable 24 to generate a reset pulse for binary counter 18 and to commence a new counting cycle for binary counter 18. When binary counter 18 is reset, the logic input states to AND gate 19 are set to zero, the output of AND gate 19 therefore is zero, and the output of inverter 20 therefore returns to a high logic state which permits AND gate 17 to permit the passage of the positive going pulses of input signal $\Delta f'$.

Counter 18 is shown as a binary counter having a capacity count of 1024 and AND gate 19 is connected so that a decision level count of 768 is required before gate 19 develops a high logic state output signal. The choice of both the counter capacity and the decision level count is totally arbitrary and the above values were assigned only as an example of typical values. In practice these values would be suitably chosen for a particular application. With a clock frequency of 100Hz and the above typical values, a high logic state will appear at terminal Q of flip-flop 21 when the frequencies of any $f_{in}$ and $f_v$ differ by 76,800 Hz or more. Any different frequency difference decision level can be obtained by changing the clock frequency or by changing the connections of the inputs to AND gate 19. Thus any amount of frequency difference can be chosen to determine if phase lock loop 11 is in a state of lock. The lock indication signal present at terminal Q of flip-flop 21, can then be used to control parameters of PLL 11, such as bandwidth.

Although a specific embodiment of a lock detector has been shown in FIG. 1 the inventive concepts are not limited to such a specific embodiment and any lock detection method which incorporates the steps of receiving two signals, producing a third signal having a frequency equal to the difference between the frequencies of the two previously received signals, counting the frequency of the difference signal, periodically comparing the frequency of the difference signal, and generating a lock indication signal which indicates the magnitude of the frequency of the difference signal relative to a predetermined decision level is within the scope of the present invention.

FIG. 3 illustrates another embodiment of a phase locked loop using the inventive lock detector. A system 30 is disclosed which contains a phase locked loop and lock detector. All of the components shown in FIG. 1 are also shown in FIG. 3 with the exception of difference frequency multiplier 15, and all components are identically interconnected and identically numbered as shown in FIG. 1. In FIG. 3, the input signal ($\Delta f$) to limiter 16 is now obtained from the output of phase comparator 12, and external input signal $f_{in}$ and the output signal of VCO 14 ($f_v$) are shown as being only coupled to input terminals of phase comparator 12. The output of phase comparator 12 produces a signal having a frequency equal to the difference between the frequency of the external input signal ($f_{in}$) and the voltage controlled oscillator input signal ($f_v$), and thus system 30 functions in an identical manner as system 10, previously described.

A lock detector system has been described which has excellent noise immunity and is capable of operating in the presence of low frequency modulation signals. Thus adaptive control of a phase lock loop is now practical for input signals having significant noise and modulation levels. By counting the number of transitions of output signal $\Delta f'$ about an arbitrary reference level an accurate lock detection system has been developed which is far superior to past amplitude sensitive lock detectors. While the present system disclosed merely produces a high logic state output if the phase locked loop is unlocked and a low logic state output if the phase locked loop is locked, the underlying concepts can be extended to more complex systems wherein the lock indication signal is an analog function of how far away from a state of lock the phase locked loop is operating. The presence of modulation on external input signal ($f_{in}$) merely results in a higher decision level number being required for determining a state of lock. The clock frequency and the cell storage locations of binary counter 18 connected to the input terminals of AND gate 19 control the decision level at which a determination of lock or unlock will be made by the inventive lock detection system.

While numerous improvements on the concepts disclosed herein will be obvious to persons skilled in the art, all such improvements which retain the basic underlying concepts are within the scope of the invention.

I claim:

1. A phase locked loop lock detector which provides a signal indicating when the phase locked loop is in a state of lock, comprising in combination:
    a phase locked loop having a phase detector receiving a first signal and a second signal and said loop adjusting the frequency of said second signal such that substantially zero phase error exists between said first and second signals;
    difference frequency means including said phase detector coupled for receiving said first and said second signals and producing a third signal having a frequency equal to the difference between said first signal frequency and said second signal frequency;
    frequency counter means coupled to said difference frequency means for receiving said third signal and counting the number of transitions of said third signal about an arbitrary reference level;
    comparator means coupled to said frequency counter means for comparing said number of transitions occurring in a predetermined time period to a predetermined decision level and generating a lock signal indicating the magnitude of said number of transitions occurring in said time period relative to said predetermined decision level.

2. The detector of claim 1 wherein said frequency counter means includes a digital counter for counting the number of transitions of said third signal about said arbitrary reference level.

3. The detector of claim 2 wherein said comparator means includes circuit means coupled to said counter means for generating said lock signal when the count of said digital counter exceeds a predetermined decision level.

4. The detector of claim 3 wherein said comparator means includes timing means coupled to said circuit means for periodically generating sampling signals for periodically monitoring the count of said digital counter.

5. The detector of claim 4 wherein said timing means is also coupled to said counter and generates reset signals for periodically resetting the count of said digital counter.

6. The detector of claim 5 wherein said circuit means includes an AND circuit having its input coupled to said digital counter, and a flip-flop circuit coupled to the output of said AND circuit, said flip-flop coupled to said timing means and receiving said sampling signal.

7. The detector of claim 6 wherein the detector includes inhibit means coupled to said digital counter for developing an inhibit signal whenever the count of said digital counter exceeds said predetermined level and said inhibit signal prevents said digital counter from continuing to count as long as said inhibit signal is present.

8. A phase locked loop lock detector which provides a signal indicating when the phase locked loop is in a state of lock, comprising in combination:
    a phase locked loop having a phase detector receiving a first signal and a second signal and said loop adjusting the frequency of said second signal such that substantially zero phase error exists between said first and second signals;
    difference frequency means coupled for receiving said first and said second signals and producing a third signal having a frequency equal to the difference between said first signal frequency and said second signal frequency;
    frequency counter means including a digital counter coupled to said difference frequency means for receiving said third signal and counting the number of transitions of said third signal about an arbitrary reference level;
    comparator means coupled to said frequency counter means for comparing said number of transitions occurring in a predetermined time period to a predetermined decision level and generating a lock indicating signal in response to the count of said digital counter exceeding said predetermined decision level;

said comparator means including timing means, an AND circuit and a flip-flop circuit, said timing means coupled to said counter for periodically generating sampling signals for periodically monitoring the count of said digital counter and for generating reset signals for periodically resetting the count of said digital counter, said AND circuit having its input coupled to said digital counter, and said flip-flop circuit coupled to the output of said AND circuit and said timing means and receiving said sampling signals.

9. The detector of claim 8 wherein the detector includes inhibit means coupled to said digital counter for developing an inhibit signal whenever the count of said digital counter exceeds said predetermined level and said inhibit signal prevents said digital counter from continuing to count as long as said inhibit signal is present.

* * * * *